United States Patent
Sakagami et al.

(10) Patent No.: US 7,046,610 B2
(45) Date of Patent: May 16, 2006

(54) RECORDING MEDIUM SUITABLE FOR RECORDING/REPRODUCING MULTI-LEVEL DATA

(75) Inventors: Koubun Sakagami, Kanagawa (JP); Yuichi Kadokawa, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 283 days.

(21) Appl. No.: 10/411,280

(22) Filed: Apr. 11, 2003

(65) Prior Publication Data

US 2004/0009371 A1    Jan. 15, 2004

(30) Foreign Application Priority Data

Apr. 24, 2002  (JP)  ............................. 2002-123008

(51) Int. Cl.
*G11B 20/12* (2006.01)
(52) U.S. Cl. ................................. 369/59.25; 369/59.24
(58) Field of Classification Search ........... 359/109.02, 359/59.24, 59.25
See application file for complete search history.

(56) References Cited

U.S. PATENT DOCUMENTS

| | | | |
|---|---|---|---|
| 3,831,145 A * | 8/1974 | Mecklenburg et al. ...... 714/810 |
| 4,870,685 A | 9/1989 | Kadokawa et al. | |
| 4,937,829 A | 6/1990 | Kadokawa | |
| 5,051,998 A | 9/1991 | Murai et al. | |
| 5,099,483 A | 3/1992 | Kadokawa | |
| 5,140,322 A | 8/1992 | Sakagami | |
| 5,142,380 A | 8/1992 | Sakagami et al. | |
| 5,414,720 A | 5/1995 | Kadokawa | |
| 5,438,601 A | 8/1995 | Maegawa et al. | |
| 5,497,194 A | 3/1996 | Sakagami et al. | |
| 6,367,047 B1 * | 4/2002 | McAuliffe et al. ......... 714/755 |

(Continued)

FOREIGN PATENT DOCUMENTS

WO    WO 97/25709    7/1997

(Continued)

OTHER PUBLICATIONS

T. L. Wong et al., "Multilevel Optical Recording", Journal of the Magnetic Society of Japan, vol. 25, No. 3, pt. 2, 2001, pp. 433-436.

(Continued)

*Primary Examiner*—Hoa T. Nguyen
*Assistant Examiner*—Adam R. Giesy
(74) *Attorney, Agent, or Firm*—Dickstein Shapiro Morin & Oshinsky LLP

(57) ABSTRACT

A recording medium with a data format is provided. The data format includes frames and an ECC block. Each of the frames includes a plurality of n-level data, n being an integer satisfying $n \geq 3$, a clock mark that is n-level data for sampling the n-level data, and a frame sync that is n-level data for indicating a break point of the n-level data of a predetermined amount. The ECC block is a data block for error correction using a product code. The ECC block is formed by binary data of J×K words, where J is a natural number indicating the number of valid binary data in each frame, and K is a natural number indicating the number of frames when the n-level data are converted into binary data.

15 Claims, 6 Drawing Sheets

U.S. PATENT DOCUMENTS

| | | | |
|---|---|---|---|
| 6,674,385 B1 * | 1/2004 | Micheloni et al. | 341/155 |
| 6,816,447 B1 * | 11/2004 | Lee et al. | 369/59.19 |
| 2003/0039191 A1 * | 2/2003 | Arioka et al. | 369/59.11 |
| 2003/0048729 A1 * | 3/2003 | Hayashi et al. | 369/59.24 |
| 2003/0110444 A1 | 6/2003 | Sakagami et al. | |
| 2003/0112667 A1 | 6/2003 | Shimizu et al. | |
| 2003/0169666 A1 * | 9/2003 | Sakagami | 369/59.24 |

FOREIGN PATENT DOCUMENTS

| | | |
|---|---|---|
| WO | WO 01/50461 | 7/2001 |

OTHER PUBLICATIONS

A. Shimizu et al., "Data Detection using Pattern Recognition for Multi-level Optical Recording", Japanese Journal of Applied Physics, vol. 41, No. 3B, March 2002, pp. 1745-1746.

ECMA: Standardizing Information and Communication Systems: "Standard ECMA-267, 3rd Edition: 120 mm DVD—Read-Only Disk" Apr. 2001, pp. 1-86.

* cited by examiner

RECORDING MEDIUM SUITABLE FOR RECORDING/REPRODUCING MULTI-LEVEL DATA

BACKGROUND OF THE INVENTION

1. Field of the Invention

The present invention relates to recording media such as an optical disk with a data format that is a data structure in recording/reproducing multi-level data.

2. Description of the Related Art

Conventionally, a recording medium having the following data format has been proposed: an optical disk having the data format of an optical disk "DVD" and recording data by performing 8/16 modulation that converts 8-bit data into 16-bit data. An ECC (Error Correction Code) block format for error correction includes user data of 2048 bytes in one sector, and 16 sectors constitute one ECC block. In addition, a product code is used for error correction, and one ECC block is formed by 182×208 bytes of data with 208 rows of 182-byte lines. There are 10 bytes of PI (Parity of Inner code) parity data according to Reed-Solomon code RS (182, 172, 11) in the row direction, and 16 bytes of PO (Parity of Outer code) parity data according to RS (208, 192, 17) in the column direction (refer to 'DVD Physical Format' PIONEER R&D 1996 Vol. 6 No. 2 (13th issue): Special Topic "DVD" p.7–p.14, and 'An outline of the 8/16 Modulation' p.32–p.36, for example).

The recording medium with the format as described above, however, has a disadvantage in that the format efficiency (the ratio of the amount of user data to the amount of total data to be recorded) is low, as shown below:

(1) format efficiency of the 8/16-modulation method=0.5× (1456 bits/1488 bits)=0.489

(2) format efficiency of ECC block=2048 bytes×16 sectors/182 bytes×208 rows=0.866

(3) total format efficiency=format efficiency of 8/16-modulation method×format efficiency of ECC block=0.423

Especially, unlike the data formats of such as conventional DVDs where all data are constructed by binary data, a data format including multi-level data requires a new process of converting multi-level data into binary data. It is necessary to devise a data format so as to avoid waste (inefficient utilization) of data capacity in the conversion process.

In addition, while user data are generally constructed by 8 bits, the unit of multi-level recording is not 8 bits. Thus, when a format is formed with 8-bit units, inefficiency is caused such as one error on the medium becomes a two-word error in relation to the conversion.

SUMMARY OF THE INVENTION

It is a general object of the present invention to provide an improved and useful recording medium in which the above-mentioned problems are eliminated.

It is another and more specific object of the present invention to provide a recording medium with a data format suitable for recording/reproducing multi-level data and having higher format efficiency than DVDs.

In order to achieve the above-mentioned objects, according to one aspect of the present invention, there is provided a recording medium with a data format, the data format including:

frames each including a plurality of symbols of n-level data, n being an integer satisfying $n \geq 3$, a clock mark that is a part of the n-level data for sampling the n-level data, and a frame sync that is a part of the n-level data for indicating a break point of the n-level data of a predetermined amount; and an ECC block that is a data block for error correction using a product code, the ECC block being formed by binary data of J×K words, J being a natural number indicating the number of words of valid binary data in each frame, and K being a natural number indicating the number of frames when the n-level data are converted into binary data.

In addition, according to another aspect of the present invention, there is also provided a recording medium with a data format, the data format including:

frames each including a plurality of sets of n-level data, a clock mark that is a part of the n-level data for sampling the n-level data, and a frame sync that is a part of the n-level data for indicating a break point of the n-level data of a predetermined amount, n being an integer satisfying $n \geq 3$, and each of the sets includes m symbols of the n-level data, m being an integer satisfying $m \geq 2$; and an ECC block that is a data block for error correction using a product code, the ECC block being formed by J×K words, J being a natural number and indicating the number of words of valid binary data in each frame, and K being a natural number and indicating the number of frames when the n-level data in the sets are converted into binary data.

In addition, in this recording medium, the number of data bits of one word in the ECC block may be equal to the number of valid data bits in one set.

Additionally, in each of the above-described recording media, binary data other than parity data in the ECC block may be divided into sectors, and each of the sectors may have a predetermined amount of binary data and include binary data indicating a sector number.

Further, the frames may include the n-level data for distinguishing between the frames including known n-level data and the frames including unknown n-level data, and the frames including the known n-level data may be inserted at a predetermined interval.

In addition, the above-described predetermined interval may be equal to one of a plurality of ECC blocks and one ECC block.

Additionally, one of the frames including the known n-level data and one of the ECC blocks may form one unit of recording and rewriting information.

Further, the words in the ECC block may each include 8 bits.

In addition, the frames of which binary data of the J words are all parity data may be arranged in one ECC block in a dispersed manner.

According to the present invention, it is possible to achieve a data format having higher format efficiency than DVDs and being suitable for recording/reproducing multi-level data.

Other objects, features and advantages of the present invention will become more apparent from the following detailed description when read in conjunction with the following drawings.

DETAILED DESCRIPTION OF THE PREFERRED EMBODIMENTS

A description will be given of embodiments of the present invention, with reference to the drawings.

The data format of a DVD disk, which is explained above in "Description of the Related Art", is divided into the data format according to 8/16-modulation (PIONEER R&D 1996 Vol. 6 No. 2 (13th issue): Special Topic "DVD", FIG. 7 p.13) and the ECC block (the said, FIG. 4). In order to clarify the differences between the format of a conventional DVD disk and the format of the recording medium according to the embodiments of the present invention, a description will be separately given for the data format constructed by multi-level data and the data format for error correction. Here, the former is called a frame format, and the latter is called an ECC block format.

First, a description will be given of a first embodiment of the recording medium according to the present invention.

The recording medium according to the first embodiment is with a data format that includes: frames each including a plurality of symbols of n-level data (n: integer satisfying $n \geq 3$), a clock mark that is n-level data for sampling the n-level data, and a frame sync that is n-level data for showing a break point of the n-level data of a predetermined amount; and an ECC block that is a data block for error correction using a product code and is formed by binary data of J×K words, where J (natural number) is the number of words of valid binary data in each frame and K (natural number) is the number of frames when the n-level data are converted into binary data.

Figure 1:
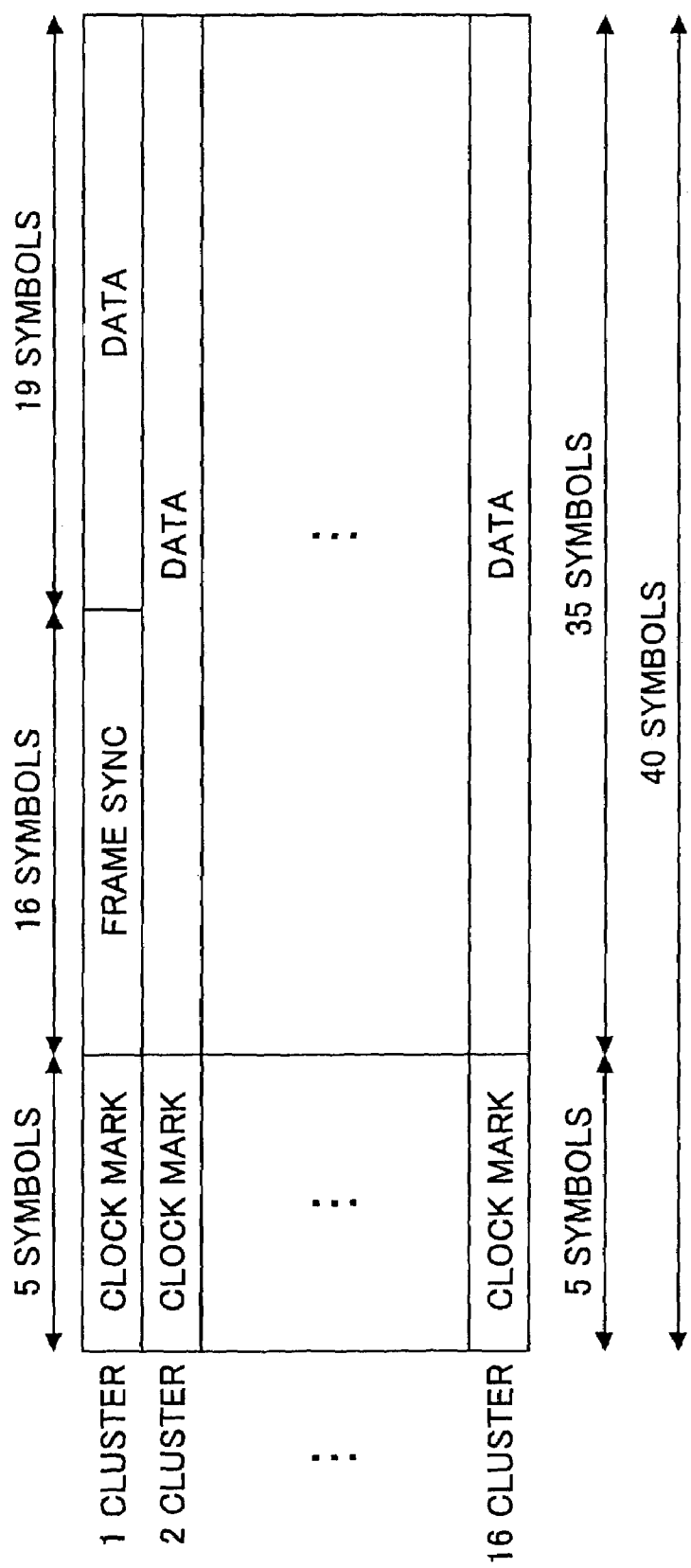
FIG. 1 is a schematic diagram showing the frame format in the data format of a recording medium according to a first embodiment of the present invention.

FIG. 1 is a schematic diagram showing the frame format in the data format of the recording medium according to the first embodiment of the present invention.

Figure 2:
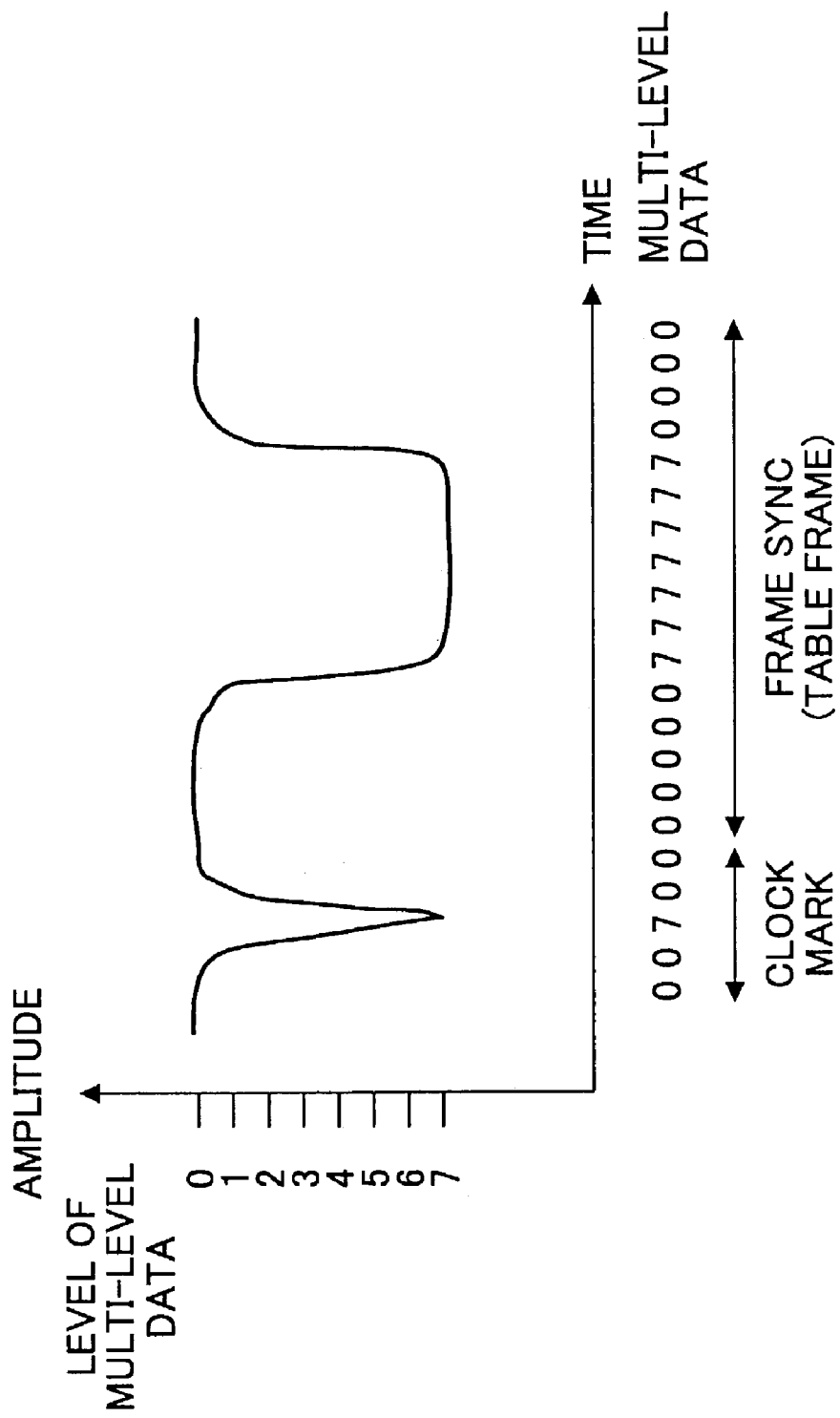
FIG. 2 is a graph showing the waveform of a reproduction signal in the case where data of a clock mark and a frame sync of the recording medium according to the first embodiment of the present invention are recorded and reproduced.

Here, multi-level data are eight-level data, and one multi-level datum is referred to as a symbol. One symbol corresponds to three bits when converted into binary data. An example of the data pattern of the clock mark and the frame sync in FIG. 1 are shown below.

clock mark = "00700"
frame sync = "0000077777770000" : table frame
"0000077777770077" : data frame FIG. 2 is a graph showing the waveform of a reproduction signal in a case where the data of the clock mark and the frame sync of the recording medium according to the first embodiment of the present invention are recorded on and reproduced from an optical disk.

The clock mark is data indicating the reference point in sampling multi-level data. As shown in FIG. 2, the bottom of the signal "7" in the middle of the clock mark is the reference. Although the illustration is omitted, multi-level data between the clock marks are sampled through generating, by a PLL circuit of an information recording/reproducing apparatus that records/reproduces information on/from the recording medium, a clock synchronized with the bottoms of the clock marks that periodically exist. Alternatively, the sampling may be performed such that the reproduction signal is subjected to A/D (analog/digital) conversion, the bottoms of the two successive clock marks are detected by digital signal processing, and multi-level data between the detected bottoms are sampled. Here, one series of data having 40 symbols starting from the clock mark is referred to as a cluster.

Whether data in the frame are the table data for multi-level data detection or user data is indicated by the last two-symbol data in the frame sync, which are referred to as a "table frame" and a "data frame", respectively.

The table data for multi-level data detection is a table used in a "multi-level recording data detection method" that records test data of all combinations of a plurality of (three) successive multi-level data on an information recording medium, creates a table storing reproduction signal values of the test data in reproduction of the multi-level data, and outputs, as reproduction multi-level data, the multi-level data with which the error between the signal value of the reproduced multi-level data and the signal value in the table becomes the minimum.

The table data are created by generating a data sequence having the minimum number of data where the test data of all combinations of the plurality of (three) successive multi-level data are not arranged regularly, but each of the combinations is included only once by using random numbers. Here, eight-level data of 514 symbols are used as the table data.

The amount of data in the frame and the format efficiency of the frame format are shown below.

(Amount of Data)

(1) Table Frame 19 symbols+(35−2) symbols×15 clusters=514 symbols

The table data are random data sequence including all combinations (8×8×8=512) only once when three eight-level data are successive. However, when divided by the clock mark being inserted in the midstream, it is necessary to overlap two symbols after the division.

Accordingly, when calculating the amount of the table data, the number of data is reduced by two symbols in each of the second through 16th clusters.

(2) Data Frame 19 symbols+35 symbols×15 clusters=544 symbols

The valid data in one frame are 544 symbols, 544 symbols×3 bits=1632 bits, and 1632 bits/8 bits=204 bytes.

(Format Efficiency)

valid data/all data=(544 symbols×3 bits)/(40 symbols×16 clusters×3 bits)=1632 bits/1920 bits=0.85

Next, a description will be given of the ECC block format of the recording medium according to the first embodiment.

Figure 3:
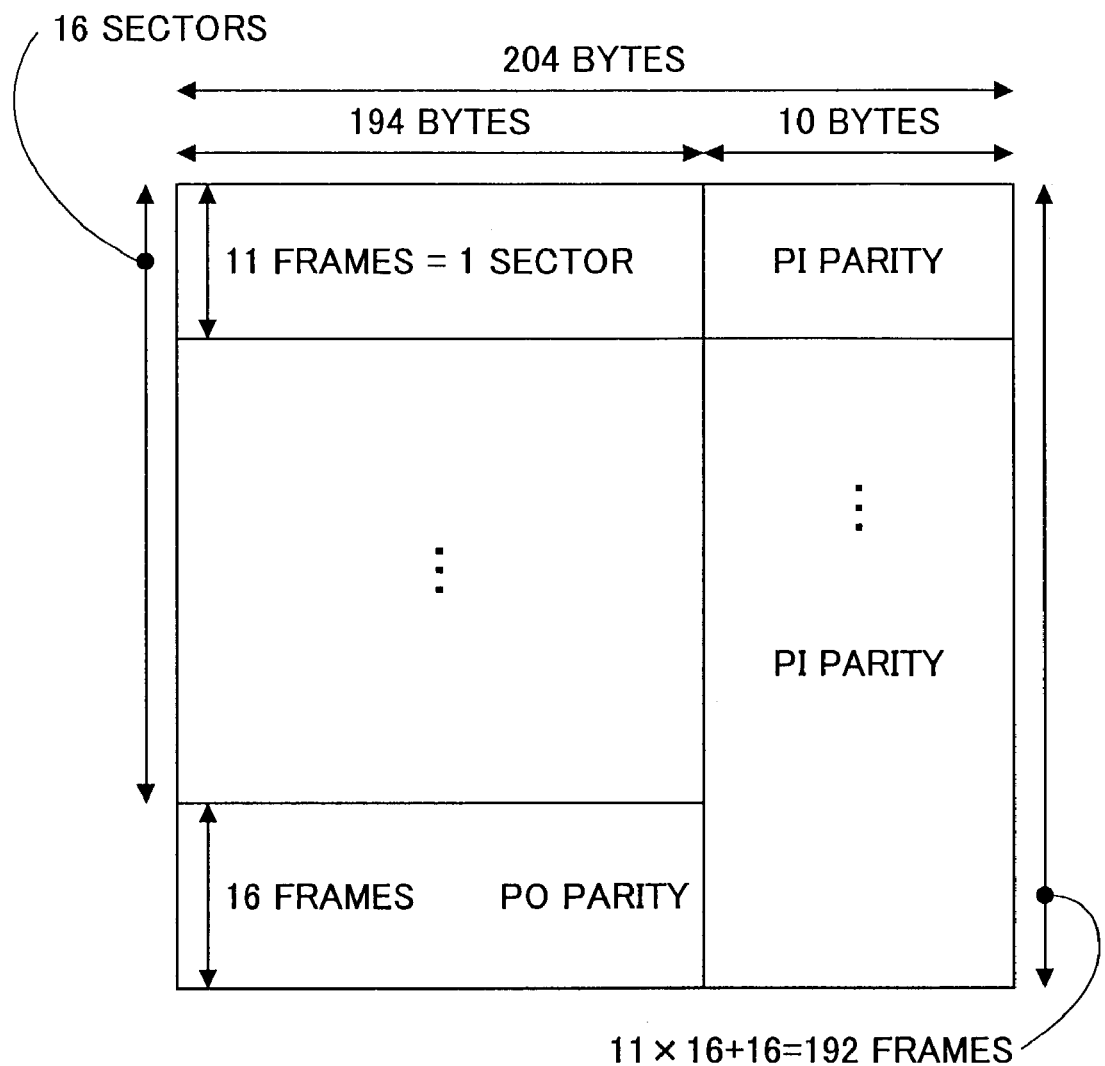
FIG. 3 is a schematic diagram showing an ECC block format of the recording medium according to the first embodiment of the present invention.

FIG. 3 is a schematic diagram showing the ECC block format of the recording medium according to the first embodiment.

As shown in FIG. 3, 204 bytes of binary data in one frame are arranged horizontally in one row, and 192 frames constitute one ECC block. Eleven frames constitute one sector, and 16 sectors form one ECC block. There are 10 bytes of PI parity data according to RS (204, 194, 11) in the row direction, and 16 bytes of PO parity data according to RS (192, 176, 17) in the column direction.

The amount of data of the sector and the ECC block, and the format efficiency of the ECC block format are shown below.

(Amount of Data)

(1) Sector

| ① | all data (capacity) | 204 bytes × 11 frames = 2244 bytes |
| ② | user data | 2048 bytes |
| ③ | additional data | 86 bytes |

The additional data are the data other than the user data of 2048 bytes in one sector. The additional data are the sector number, information for managing copyright, the data for error detection of data in the sector, and the like.

(2) ECC Block

| ① | all data | 204 bytes × 192 frames = 39168 bytes |
| ② | user data | 2048 bytes × 16 sectors = 32768 bytes |

(Format Efficiency)

user data/all data=32768 bytes/39168 bytes×192/193=0.832

Here, the format efficiency in the case of inserting one table frame per one ECC block is shown. The total format efficiency is the product of the format efficiency of the frame format and the format efficiency of the ECC block format, which is shown below.

0.85×0.832=0.707

As described above, the format efficiency of the recording medium according to the first embodiment is 0.707, which is higher than the format efficiencies of DVDs.

In the recording medium according to the present invention, the format efficiency is high since the frame format using multi-level data is used. Also, since the number of valid binary data in the frame matches the number of words for one row in error correction, it is possible to achieve a highly efficient data format that does not waste data capacity in the conversion process from multi-level data to binary data.

Next, a description will be given of a second embodiment of the recording medium according to the present invention.

The recording medium according to the second embodiment is provided with a data format that includes: frames each including a plurality of sets of n-level data, where one set includes m symbols (m: integer satisfying $m \geq 2$) of the n-level data (n: integer satisfying $n \geq 3$), the clock mark that is n-level data for sampling the n-level data, and the frame sync that is n-level data for showing the break point of the n-level data of a predetermined amount; and the ECC block that is the data block for error correction using a product code and is formed by binary data of J×K words, where J (natural number) is the number of words of valid binary data in each frame, and K (natural number) is the number of frames when the n-level data in the sets are converted into binary data.

The recording medium with this format is suitable for converting binary data into multi-level data by the following data processing method, that is, a method of handling a plurality of multi-level data as one set, arranging binary data as is with respect to the higher bits of each multi-level datum, and arranging data according to a predetermined conversion rule in the lowest one bit. When reproducing the multi-level data, the lowest one bit is error-prone. Thus, the multi-level data are determined by using the fact that the data are in accordance with the predetermined conversion rule. Redundant data of one bit are generated due to the predetermined conversion rule, however, the determination accuracy of multi-level data is improved.

A description will be given of a specific method of converting binary data into multi-level data.

When recording/transmitting multi-level data of n bits/symbol ($n \geq 2$), assuming that m symbols ($m \geq 2$) form one set, arbitrary binary data are arranged in the higher (n−1) bits×m symbols={(n−1)×m} bits of each symbol, and binary data where (m−1) bits are converted into m bits (the predetermined conversion rule) are arranged in the lower 1 bit×m symbols=m bits.

A description will be given of the data format of the recording medium according to the second embodiment.

Here, it is assumed that binary data are converted into multi-level data in the manner described below as an example.

Arranging multi-level (eight-level) data of 3 bits/symbol for four symbols so as to form one set, arbitrary binary data are arranged in the top 2 bits of each symbol×4 symbols=8 bits, and binary data where arbitrary binary data of 3 bits are converted into 4 bits are arranged in the lowest 1 bit×4 symbols=4 bits. In other words, arbitrary binary data of 11 bits are converted into 12 bits so as to form one set.

The frame format of the recording medium according to the second embodiment is basically the same as the frame format of the recording medium according to the first embodiment. Accordingly, the amount of data of the table frame and that of the data frame are the same as those in the first embodiment. However, since four symbols form one set, and valid data in the one set are 11 bits, the format efficiency is varied from the first embodiment.

The calculation formulas are shown below.

(Amount of Data of Data Frame)

19 symbols+35 symbols×15 clusters=544 symbols=136 sets×4 symbols 136 sets×11 bits=1496 bits=187 bytes (Format Efficiency)

valid data/all data=1496 bits/1920 bits=0.779

Figure 4:
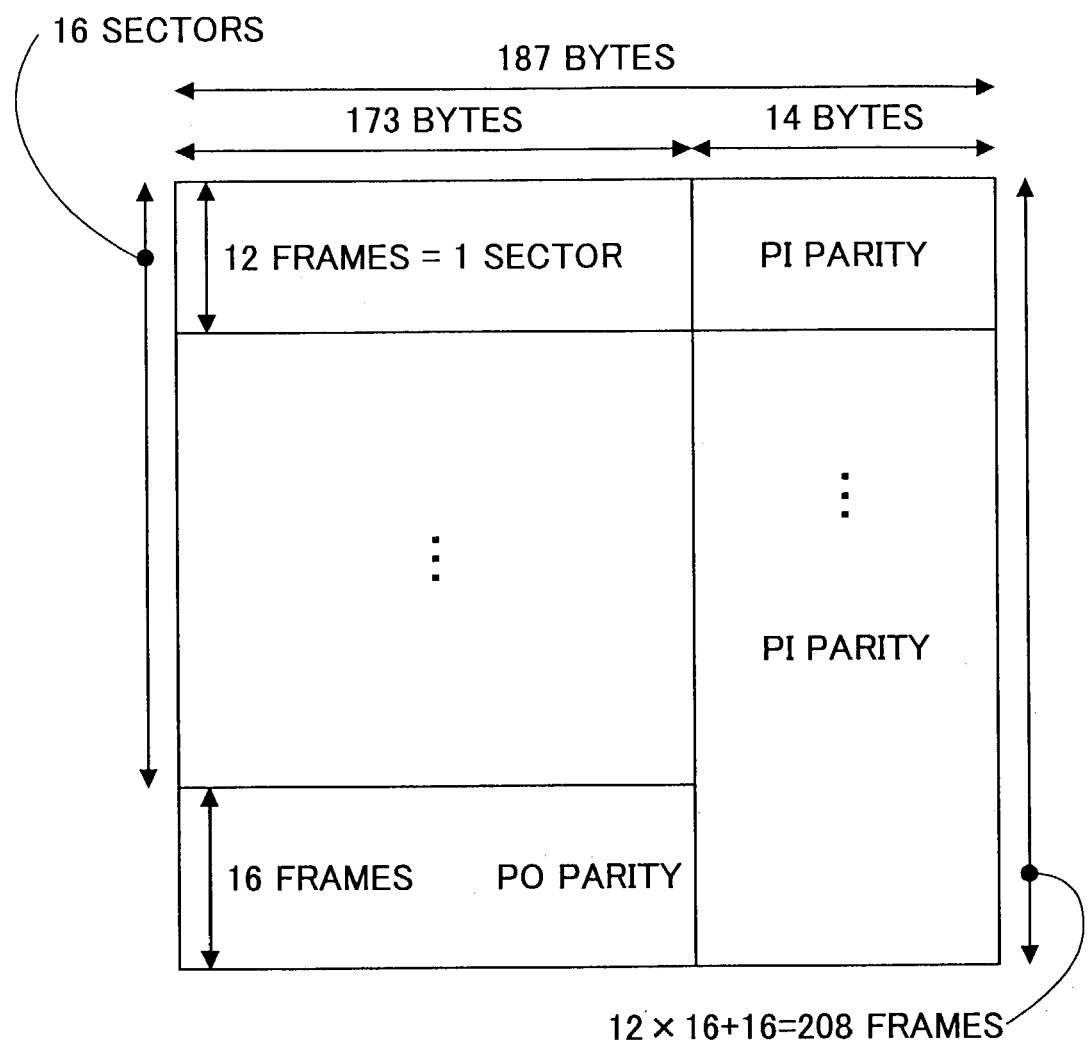
FIG. 4 is a schematic diagram showing the ECC block format of a recording medium according to a second embodiment of the present invention.

FIG. 4 is a schematic diagram showing the ECC block format of the recording medium according to the second embodiment. The amounts of data of the sector and the ECC block, and the format efficiency of the ECC block format are shown below.

(Amount of Data)
(1) Sector

| | | |
|---|---|---|
| ① | all data | 187 bytes × 12 frames = 2244 bytes |
| ② | user data | 2048 bytes |
| ③ | additional data | 28 bytes |

(2) ECC Block

| | | |
|---|---|---|
| ① | all data | 187 bytes × 208 frames = 38896 bytes |
| ② | user data | 2048 bytes × 16 sectors = 32768 bytes |

(Format Efficiency)

user data/all data=32768 bytes/38896 bytes=0.842

The total format efficiency becomes the following value.

0.779×0.842=0.656

As described above, the format efficiency of the recording medium according to the second embodiment is 0.656, which is higher than the format efficiencies of DVDs.

In the recording medium according to the second embodiment of the present invention, the format efficiency is high since the frame format using multi-level data is used. Further, since the amount of data in the frame is in units of sets, it is possible to correspond to a conversion process where redundant data are added in units of sets.

In addition, in each of the recording media according to the first and second embodiments, the sector may be formed through dividing, by a predetermined amount, data other than the parity data in the ECC block, and each of the sectors may include data representing the sector number.

As described above, if the sector includes the sector number as the additional data in addition to the user data, it is possible to detect the ECC block of a 16-sector unit by the sector number in data reproduction.

With such a recording medium, since each sector in the ECC block includes information of the sector number, it is possible to easily detect the ECC block.

Further, in the second embodiment, it is unnecessary to insert a table frame. However, the table frame of the first embodiment may be inserted as known data for automatic equalization in the case of performing waveform equalization in data reproduction.

That is, the frame may include multi-level data for distinguishing between the frames having known multi-level data and the frames having unknown multi-level data, and the frames having known multi-level data may be inserted at predetermined intervals.

In such a recording medium, since the table frames are inserted at the predetermined intervals, it is possible to perform periodic signal calibration, and thus the reliability of data reproduction is improved.

In this manner, it is possible to combine the multi-level recording data detection method of recording test data of all combinations of a plurality of (three) successive multi-level data on an information recording medium, creating a table that stores reproduction signal values of the test data in reproduction of the multi-level data, and outputting the multi-level data with which the error between the signal value of the reproduced multi-level data and the signal value in the table becomes minimum, and the data processing method of handling a plurality of multi-level data as one set, arranging binary data as is in the higher bits of each of the multi-level data, arranging data according to the predetermined conversion rule in the one lowest bit, and, since the one lowest bit is error-prone, determining the multi-level data by using the fact that the data is in accordance with the predetermined conversion rule in reproduction of the multi-level data.

For example, when multi-level data are recorded on an optical disk, due to variations in the materials of the optical disk, there are cases where reproduction signals vary depending on the reproduction position on the disk. Data of the table frame where known data are recorded may be used as reference data for calibrating the variations.

As described above, the reliability of reproduced data is improved when the table frames are inserted in the inner, middle, and peripheral tracks of the disk at predetermined intervals, such as every several tracks and every single track, so as to perform regular signal calibration in data reproduction.

In addition, preferably the above-described interval is a plurality of the ECC blocks or one ECC block.

First, when the table frames are inserted at every several ECC blocks, the frequency of the calibration is increased, and therefore the reliability is further improved. Moreover, when detecting the ECC blocks, it is possible to doubly verify the break points of the ECC block by the table frames in parallel with the detection by the sector numbers. Thus, it is possible to reduce errors in reproduced data due to erroneous detection of the ECC blocks.

Further, in the recording medium according to the first embodiment, one table frame is inserted per one ECC block. Thus, the frequency of the calibration is further increased, and it is also possible to detect one ECC block by the table frame. Accordingly, it is possible to doubly verify the break point per one ECC block, and further reduce errors in reproduced data due to erroneous detection of the ECC blocks.

When one table frame is inserted every plural ECC blocks as described above, the frequency of signal calibration is increased, the confirmation of the ECC block detection can also be performed, and the reliability of data reproduction is improved.

Or, when one table frame is inserted per one ECC block, the frequency of signal calibration is further increased, the confirmation of detection of one ECC block can also be performed, and the reliability of data reproduction is improved.

Further, preferably the data of one word in the ECC block are 8 bits.

In the recording media according to the first and second embodiments, since the number of data of valid data in one frame is counted in bytes (8 bits), Reed-Solomon code operation may be performed as in conventional DVD disks. Accordingly, since the data of one word in the ECC block are 8 bits, there is an advantage in that a circuit may be shared when an optical disk drive is made capable of using both DVD disks and multi-level recording optical disks according to the embodiments.

Next, a description will be given of a third embodiment of the recording medium according to the present invention.

The format of the recording medium according to the third embodiment is such that the number of data bits of one word in the ECC block is made equal to the number of valid data bits in one set in the recording medium according to the second embodiment.

Figure 5:
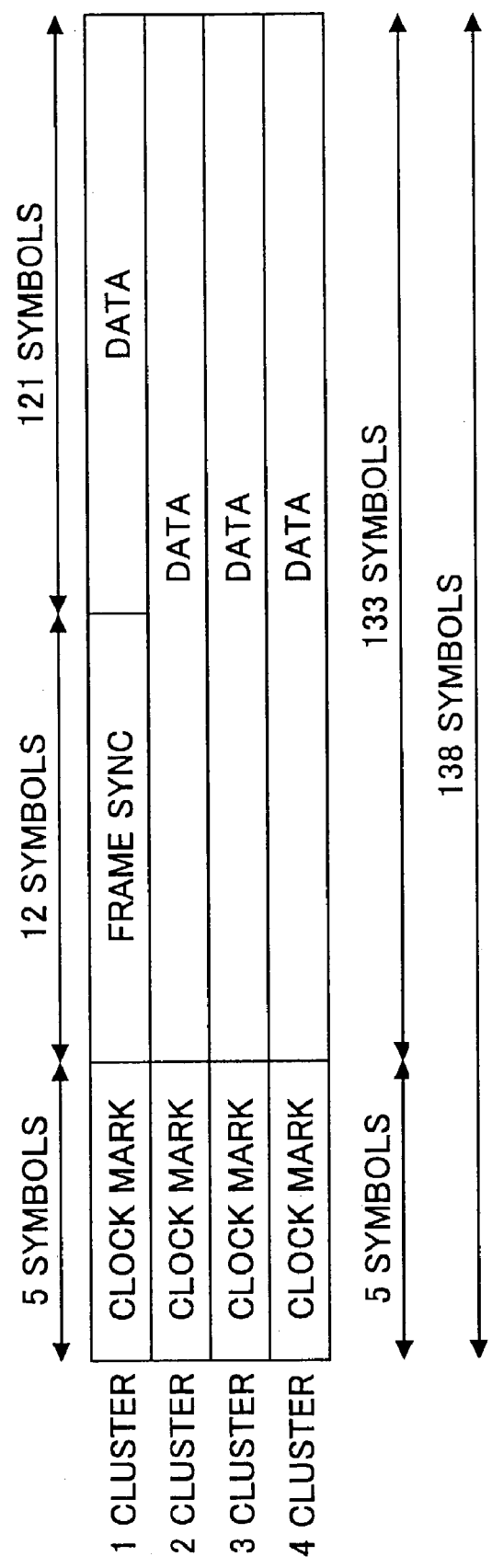
FIG. 5 is a schematic diagram showing the frame format of the recording medium according to the third embodiment of the present invention.
Figure 6:
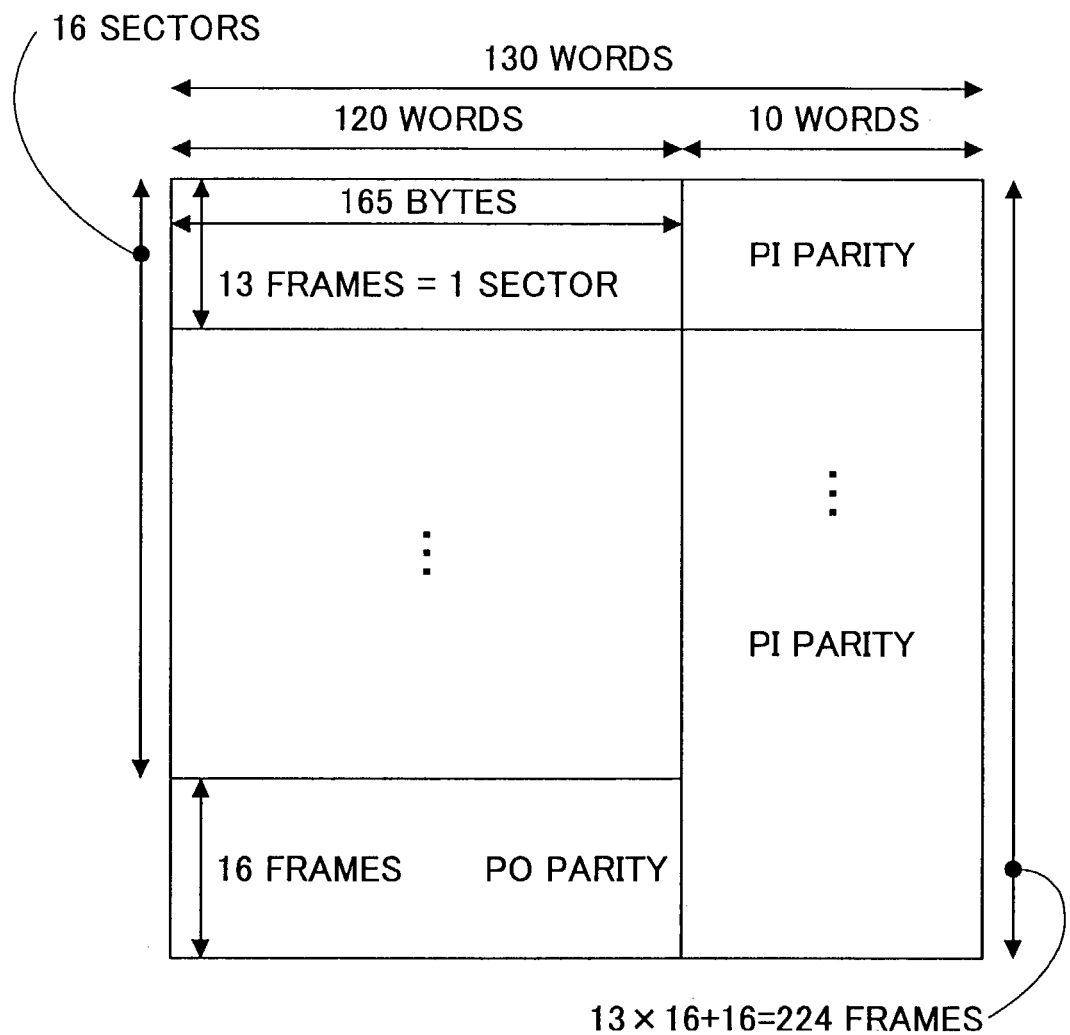
FIG. 6 is a schematic diagram showing the ECC block format of the recording medium according to the third embodiment of the present invention.

Next, a description will be given of the data format where the number of valid data in one frame is not in bytes. This is the data format in the case where the number of valid data bits in one set is 11 bits as in the recording medium according to the second embodiment. FIG. 5 shows the frame format of the recording medium according to the third embodiment. FIG. 6 shows the ECC block format of the recording medium according to the third embodiment.

The data patterns of the clock mark and the frame sync in FIG. 5 are shown below.

clock mark = "00700"
frame sync = "000777770000" : table frame
"000777770077" : data frame The amount of data in the frame and the format efficiency of the frame format are shown below.

(Amount of Data)
  (1) Table Frame 121 symbols+(133−2) symbols×3 clusters=514 symbols (2) Data Frame 121 symbols+133 symbols×3 clusters=520 symbols=130 sets 130 sets×11 bits=1430 bits (=178.75 bytes)

(Format Efficiency)

valid data/all data=1430 bits/1656 bits (=138 symbols×4 clusters×3 bits)=0.864

The amounts of data of the sector and the ECC block, and the format efficiency of the ECC block format are shown below.

(Amount of Data)
  (1) Sector

| ① | sector data | 165 bytes × 13 frames = 2145 bytes |
| ② | user data | 2048 bytes |
| ③ | additional data | 97 bytes |

(2) ECC Block

| ① | all data | 130 words × 224 frames × 11 bits = 320320 bits |
| ② | user data | 2048 bytes × 16 sectors = 32768 bytes = 262144 bits |

(Format Efficiency)

user data/all data=262144 bits/320320 bits×224/225=0.814

Here, the format efficiency in the case where one table frame is inserted per one ECC block is shown.

As describe above, it is also possible for the recording medium according to the third embodiment to achieve higher format efficiency than those of DVDs.

That is, if the number of valid data bits in one set is made equal to the number of bits of one word in the Reed-Solomon operation (1 word=11 bits), when binary data are extracted from the frame data and converted into data for the ECC block, it is possible to output data of one word in sets. Thus, it is possible to simplify a conversion circuit. Further, since the number of valid data bits in one set is set to one word in error correction, one random error on the medium never becomes two words in relation to conversion. Thus, an effective format is achieved.

In addition, in the ECC block formats of the recording media according to the first through third embodiments, the frames having the PO parities are concentrated in the lower region of the ECC block. When actually recording on such as an optical disk, those frames may be arranged in a dispersed manner.

In other words, preferably, frames of which data of J words are all parity data are arranged in a dispersed manner in one ECC block.

In this way, data errors due to flaws and contamination on the recording medium are dispersed, and thus reliability of reproduced data is improved.

In a recording medium with such an ECC block format, the frames having the PO parity data are arranged in a dispersed manner in one ECC block. Hence, data errors due to flaws and contamination on the recording surface are dispersed, and thus the reliability of reproduced data is improved.

In addition, preferably, the frame having known multi-level data and one ECC block form one unit of recording and rewriting information.

That is, when one table frame is inserted per one ECC block, the ECC block and the table frame may form one unit of information of recording and rewriting data.

In this manner, when data are recorded on an optical disk in the unit of ECC blocks by a plurality of optical disk apparatuses, the table frames are also recorded. Hence, it is possible to perform calibration of signals in the unit of ECC blocks. Thus, it is possible to ensure compatibility in reproducing data by an optical disk apparatus that is different from the optical disk apparatuses used in recording.

As described above, with the recording medium according the present invention, it is possible to achieve a data format having higher format efficiency than DVDs and being suitable for recording/reproducing multi-level data.

The present invention is not limited to the specifically disclosed embodiments, and variations and modifications may be made without departing from the scope of the present invention.

The present application is based on Japanese priority application No. 2002-123008 filed on Apr. 24, 2002, the entire contents of which are hereby incorporated by reference.

What is claimed is:

1. A recording medium with a data format, said data format comprising:
  frames each including a plurality of symbols of n-level data, n being an integer satisfying n≧3, a clock mark that is a part of the n-level data for sampling the n-level data, and a frame sync that is a part of the n-level data for indicating a break point of the n-level data of a predetermined amount; and
  an ECC block that is a data block for error correction using a product code, said ECC block being formed by binary data of J×K words, J being a natural number indicating a number of words of valid binary data in each frame, and K being a natural number indicating a number of the frames when the n-level data are converted into binary data.

2. The recording medium as claimed in claim 1, wherein the binary data other than parity data in the ECC block are divided into sectors, each of said sectors having a predetermined amount of the binary data and including the binary data indicating a sector number.

3. The recording medium as claimed in claim 2, wherein each of the frames includes the n-level data for distinguishing between the frames including known n-level data and the frames including unknown n-level data, and the frames including the known n-level data are arranged at a predetermined interval.

4. The recording medium as claimed in claim 3, wherein the predetermined interval is equal to one of a plurality of the ECC blocks and one of the ECC blocks.

5. The recording medium as claimed in claim 3, wherein one of the frames including the known n-level data and one of the ECC blocks form one unit of recording and rewriting information.

6. The recording medium as claimed in claim 1, wherein the words in the ECC block each comprises eight bits.

7. The recording medium as claimed in claim 1, wherein the frames of which binary data of the J words are all parity data are arranged in the ECC block in a dispersed manner.

8. A recording medium with a data format, said data format comprising:
frames each including a plurality of sets of n-level data, a clock mark that is a part of the n-level data for sampling the n-level data, and a frame sync that is a part of the n-level data for indicating a break point of the n-level data of a predetermined amount, n being an integer satisfying $n \geq 3$, and each of said sets including m symbols of the n-level data, m being an integer satisfying $m \geq 2$; and
an ECC block that is a data block for error correction using a product code, said ECC block being formed by J×K words, J being a natural number indicating a number of words of valid binary data in each frame, and K being a natural number indicating a number of frames when the n-level data in the sets are converted into binary data.

9. The recording medium as claimed in claim 8, wherein the binary data other than parity data in the ECC block are divided into sectors, each of said sectors having a predetermined amount of the binary data and including the binary data indicating a sector number.

10. The recording medium as claimed in claim 9, wherein each of the frames includes the multi-level data for distinguishing between the frames including known data and the frames including unknown data, and the frames including the known data are arranged at a predetermined interval.

11. The recording medium as claimed in claim 10, wherein the predetermined interval is equal to one of a plurality of the ECC blocks and one of the ECC blocks.

12. The recording medium as claimed in claim 10, wherein one of the frames including the known multi-level data and one of the ECC blocks form one unit of recording and rewriting information.

13. The recording medium as claimed in claim 8, wherein the words in the ECC block each comprises eight bits.

14. The recording medium as claimed in claim 8, wherein the-number of data bits of each of the words in the ECC block is equal to the number of valid data bits in one set.

15. The recording medium as claimed in claim 8, wherein the frames of which binary data of the J words are all parity data are arranged in the ECC block in a dispersed manner.

* * * * *